US010164438B2

(12) United States Patent
Nishigai

(10) Patent No.: US 10,164,438 B2
(45) Date of Patent: Dec. 25, 2018

(54) POWER-SUPPLY DEVICE DETERMINATION APPARATUS, POWER-SUPPLY DEVICE DETERMINATION METHOD, AND POWER CONVERSION APPARATUS

(71) Applicant: KYOCERA Corporation, Kyoto-shi, Kyoto (JP)

(72) Inventor: Takanobu Nishigai, Hiratsuka (JP)

(73) Assignee: KYOCERA Corporation, Kyoto (JP)

(*) Notice: Subject to any disclaimer, the term of this patent is extended or adjusted under 35 U.S.C. 154(b) by 160 days.

(21) Appl. No.: 14/908,409

(22) PCT Filed: Jul. 28, 2014

(86) PCT No.: PCT/JP2014/003960
§ 371 (c)(1),
(2) Date: Jan. 28, 2016

(87) PCT Pub. No.: WO2015/015794
PCT Pub. Date: Feb. 5, 2015

(65) Prior Publication Data
US 2016/0197481 A1   Jul. 7, 2016

(30) Foreign Application Priority Data
Jul. 29, 2013 (JP) .................................. 2013-157085

(51) Int. Cl.
H02J 3/00 (2006.01)
H02J 3/38 (2006.01)
(Continued)

(52) U.S. Cl.
CPC .............. *H02J 3/383* (2013.01); *G01R 21/00* (2013.01); *H02J 1/12* (2013.01); *H02J 3/38* (2013.01);
(Continued)

(58) Field of Classification Search
USPC ........................................................ 307/82
See application file for complete search history.

(56) References Cited

U.S. PATENT DOCUMENTS 6,633,802 B2 * 10/2003 Sodoski ............. B60L 15/2045
307/29
2010/0207454 A1   8/2010 Jagota et al.
(Continued)

FOREIGN PATENT DOCUMENTS

EP    2 278 678 A2    1/2011
JP    2002-218654 A    8/2002
(Continued)

OTHER PUBLICATIONS

International Search Report issued by the Japanese Patent Office for International Application No. PCT/JP2014/003960.
(Continued)

*Primary Examiner* — Rexford Barnie
*Assistant Examiner* — Dru Parries
(74) *Attorney, Agent, or Firm* — Procopio Cory Hargreaves and Savitch LLP

(57) ABSTRACT

Provided is a determination apparatus and determination method for automatically determining the types of power-supply devices connected, in a power conversion apparatus employing a DC link. The determination apparatus includes: a plurality of connectors that may be connected with the plurality of power-supply devices; a plurality of voltage transducers connected in series with the plurality of connectors; a voltage measuring part configured to measure output voltage values having passed through the plurality of voltage transducers; and a controller determining the plurality of power-supply devices, based on the output voltage values measured by the voltage measuring part when the plurality of voltage transducers have the same step-up ratio, (Continued)

to thereby automatically determine the power-supply devices connected thereto.

9 Claims, 11 Drawing Sheets

(51) Int. Cl.
 *H02J 1/12* (2006.01)
 *G01R 21/00* (2006.01)
 *H02J 7/00* (2006.01)
 *H02J 7/35* (2006.01)
 *H02M 7/44* (2006.01)

(52) U.S. Cl.
 CPC ............ *H02J 3/387* (2013.01); *H02J 7/0052* (2013.01); *H02J 7/35* (2013.01); *H02M 7/44* (2013.01)

(56) References Cited

U.S. PATENT DOCUMENTS

| | | | |
|---|---|---|---|
| 2012/0119586 A1 | 5/2012 | Carralero et al. | |
| 2014/0008986 A1 | 1/2014 | Miyauchi et al. | |
| 2015/0244176 A1* | 8/2015 | Van Den Brink | H02J 5/005 |
| | | | 307/104 |

FOREIGN PATENT DOCUMENTS

| | | |
|---|---|---|
| JP | 2012-100504 A | 5/2012 |
| WO | 2012/132948 A1 | 4/2012 |

OTHER PUBLICATIONS

Extended European Search Report dated Feb. 15, 2017 issued by the European Patent Office in counterpart European Patent Application No. 14 832 635.8.

* cited by examiner

POWER-SUPPLY DEVICE DETERMINATION APPARATUS, POWER-SUPPLY DEVICE DETERMINATION METHOD, AND POWER CONVERSION APPARATUS

CROSS REFERENCE TO RELATED APPLICATIONS

The present application claims the priority from Japanese Patent Application No. 2013-157085 filed on Jul. 29, 2013, the entire disclosures of which is incorporated herein by reference.

TECHNICAL FIELD

This disclosure relates to a power-supply device determination apparatus for determining the types of the power-supply devices, a power-supply device determination method, and a power conversion apparatus including the apparatus and the method.

BACKGROUND

A power control system is desired to centrally control and operate a plurality of power-supply devices including solar cells, storage batteries, fuel cells, wind power generators, and hydraulic generators. Particularly in recent years, aiming at facilitating control, improving efficiency, and reducing cost, a DC link system has been proposed in which various power-supply devices are connected without converting DC powers thereof. In the system, powers from solar cells and fuel cells are linked as DC powers and directly charged into a storage battery, and then converted into AC power using a single inverter, to thereby supply the power to a load. The DC link system eliminates the conventional need to convert respective outputs from the power-supply devices by inverters, and thus minimizes the conversion loss to thereby allow for improving efficiency. The DC link system also simplifies the system, which leads to cost reduction. Further, the DC link system links DC powers, with which power can be advantageously controlled with ease.

CITATION LIST

Patent Literature
    PTL 1: JP 2002-218654 A

SUMMARY

Technical Problem

The DC link system has a plurality of power-supply devices connected thereto, which are generally different from one another in output voltage. Accordingly, the outputs from the devices must be stepped up to the same voltage in order to connect the outputs without converting the DC powers so as to construct the DC link system. However, in the conventional power control system, it has been difficult to automatically determine what kind of power-supply devices are connected to the system. Therefore, in such a power control system as disclosed in Patent Literature (PTL) 1, the user must make individual settings for respective power-supply devices connected to the system in order to convert the output powers from the plurality of power-supply devices into powers applicable to the loads.

Then, in the DC link system of PTL 1, the user has also been required to individually identify the types of the power-supply devices connected, and to set a DC/DC converter to step up the output voltage by a step-up ratio corresponding to the type of the device.

It could therefore be helpful to provide a determination apparatus for automatically determining the power-supply devices connected to a power conversion apparatus that employs a DC link system.

Solution to Problem

In order to solve the aforementioned problems, provided is a power-supply device determination apparatus that may be connected with a plurality of power-supply devices, including:
    a plurality of connectors that may be connected with the plurality of power-supply devices;
    a plurality of voltage transducers connected in series with the plurality of connectors;
    a voltage measuring part for measuring output voltage values having passed through the plurality of voltage transducers; and
    a controller configured to determine the plurality of power-supply devices, based on the output voltage values measured by the voltage measuring part when the plurality of voltage transducers have the same step-up ratio.

Further, the controller may preferably switch between a device determination mode configured to determine the plurality of power-supply devices, based on the voltage values measured by the voltage measuring part when the plurality of voltage transducers have the same step-up ratio, and a steady operation mode configured to individually control step-up ratios of the plurality of voltage transducers.

Further, the controller may preferably individually control step-up ratios of the plurality of voltage transducers, based on the result of determination on the plurality of power-supply devices in the device determination mode.

Further, the controller may preferably individually control step-up ratios of the plurality of voltage transducers so that the plurality of voltage transducers output the same voltage in the steady operation mode.

Further, the disclosed power-supply device determination apparatus may preferably further include a gang switch configured to turn ON/OFF the connection of power output from the plurality of voltage transducers, and the controller may preferably turn OFF the gang switch in the device determination mode and turn ON the gang switch in the steady operation mode.

Further, the determining of the plurality of power-supply devices may preferably include identifying the types of the plurality of the power-supply devices.

Further, the determining of the plurality of power-supply devices may preferably include deciding optimum step-up ratios for the plurality of power-supply devices.

Further, in order to solve the aforementioned problems, provided is a power conversion apparatus that may be connected with a plurality of power-supply devices, including:
    a plurality of connectors that may be connected with the plurality of power-supply devices;
    a plurality of voltage transducers connected in series with the plurality of connection parts;
    a voltage measuring part configured to measure output voltage values having passed through the plurality of voltage transducers;
    a controller configured to perform control so as to be capable of switching between a device determination mode configured to determine the plurality of power-supply devices, based on the output voltage values measured by the voltage measuring part when the plurality of voltage transducers have the same step-up ratio, and a steady operation mode configured to individually control step-up ratios of the plurality of voltage transducers.

Further, in order to solve the aforementioned problems, provided is a method for determining a plurality of power-supply devices, including:

a first voltage conversion step of voltage-converting, at the same step-up ratio, output powers of the plurality of power-supply devices;

a voltage measuring step of measuring output voltage values having been voltage-converted by voltage transducers in the first voltage conversion step; and a determination step of determining the plurality of power-supply devices based on the output voltage values measured in the voltage measuring step.

Further, the method may preferably further include a second voltage conversion step of individually controlling step-up ratios of the plurality of voltage transducers, based on determination information obtained in the determination step of determining the power-supply devices.

Advantageous Effect

The disclosed apparatus and method are capable of automatically determining a plurality of power-supply devices connected to a power conversion apparatus employing a DC link, so as to control the devices to output the same voltage after DC/DC conversion.

DETAILED DESCRIPTION

In the following, Embodiments of this disclosure are described with reference to the accompanying drawings.

Embodiment 1

Figure 1:
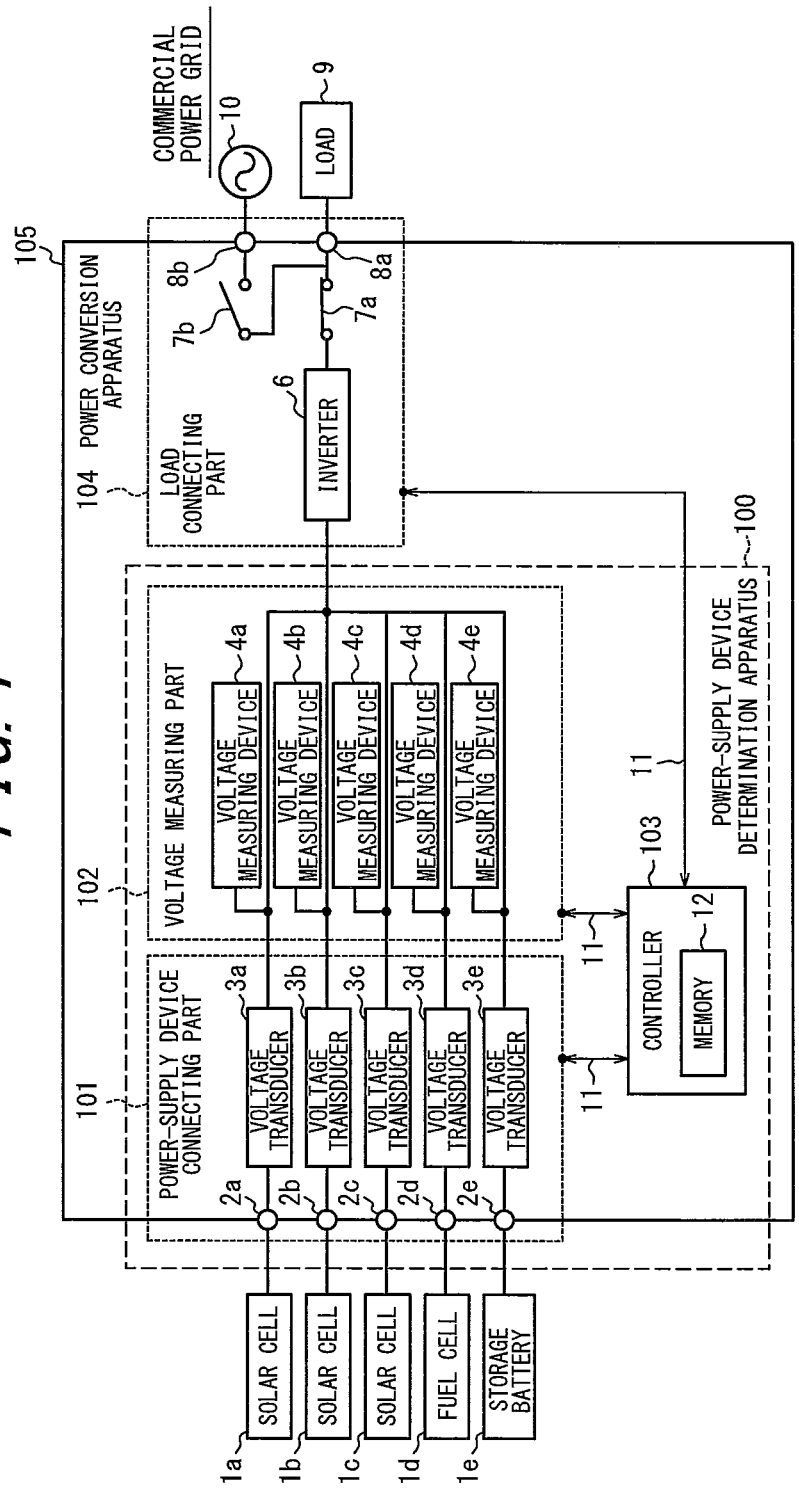
FIG. 1 is a block diagram illustrating a configuration of a power-supply device determination apparatus and a power conversion apparatus according to Embodiment 1 disclosed herein.

FIG. 1 is a block diagram illustrating a configuration of a power conversion apparatus 105 including a power-supply device determination apparatus 100 according to Embodiment 1 disclosed herein. The power-supply device determination apparatus 100 of Embodiment 1 includes: a power-supply device connecting part 101 for connecting a plurality of power-supply devices; a voltage measuring part 102 for measuring output voltages from the power-supply devices; and a controller 103 for controlling the respective components. The power conversion apparatus 105 further includes a load connecting part 104 for connecting to loads.

First, a configuration and an operation of the power-supply device connecting part 101 are described. The power-supply device connecting part 101 includes power-supply device connection terminals $2a$ to $2e$ to connect the respective power-supply devices $1a$ to $1e$. The power-supply device connecting part 101 further includes voltage transducers $3a$ to $3e$ for DC/DC converting powers input from the respective power-supply devices. Powers stepped up or stepped down by the voltage transducers are output to voltage measuring devices $4a$ to $4e$ in a voltage measuring part 102.

The power-supply device connecting terminals $2a$ to $2e$ may include power terminals for inputting/outputting power between the power-supply devices and the disclosed power conversion apparatus, and a control signal terminal for controlling, by the controller 103, the power-supply devices. In Embodiment 1, the power-supply devices $1a$ to $1c$ (solar cells) are connected to the power-supply device connection terminals $2a$ to $2c$. A power-supply device $1d$ (fuel cell) is connected to the power-supply device connection terminal $2d$. The power-supply device $1e$ (storage battery) is connected to the power-supply device connection terminal $2e$.

Solar cells convert solar energy into DC power. A solar cell may includes, for example, multiple photoelectric conversion cells connected in series so as to output a predetermined current when irradiated with sunlight. In Embodiment 1, silicon-based polycrystalline solar cells may be used as the solar cells to be connected to the power-supply device connection terminals $2a$ to $2c$. However, the solar cells are not limited thereto, and may employ any type including, for example, silicon-based monocrystalline solar cells or thin-film solar cells such as CIGS cells, with no limitation on the type as long as being capable of photoelectric conversion.

Fuel cells use hydrogen as fuel and generate power through chemical reaction between hydrogen and oxygen in air. Fuel cells are classified into, for example, the solid oxide fuel cell and the polymer electrolyte fuel cell, depending on the material used as the electrolyte. The fuel cell used in this embodiment is not particularly limited to any specific type.

The storage battery used in this embodiment may employ, for example, a lithium-ion battery. Further, storage batteries of other types, such as a nickel-hydrogen storage battery, may also be used. The storage battery may be used alone or may be mounted on electric vehicles (EV) or plug-in hybrid vehicles (PHV) to be charged.

Here, the power-supply devices to be connected to the power-supply device connection terminals 2a to 2e may include solar cells, fuel cells, and storage batteries, and may also include, for example, a wind power generator and a compact hydraulic generator, which rectify AC power to output.

The voltage transducers 3a to 3e each DC/DC convert output voltages of the power-supply devices at a predetermined step-up ratio, based on a control signal 11 from the controller 103. In the specification, the step-up ratio refers to a ratio of DC output voltage value to DC input voltage value in the voltage transducers 3a to 3e.

Next, a configuration and an operation of the voltage measuring part 102 are described. The voltage measuring part 102 includes voltage measuring devices 4a to 4e for measuring the voltages of DC powers output from the voltage transducers 3a to 3e. In Embodiment 1, output powers from the voltage transducers 3a to 3e are each measured by an individual one of the voltage measuring devices 4a to 4e, respectively.

Next, a configuration and an operation of the controller 103 are described. The controller 103 is capable of communicating, through the control signal 11 of FIG. 1, with: the power-supply devices 1a to 1e; the voltage transducers 3a to 3e; the voltage measuring devices 4a to 4e; an inverter 6; switches 7a, 7b to be described later in the load connecting part 104; and the load 9, so as to perform various controls on the components. Specifically, the controller 103 is capable of, for example: performing ON/OFF control of the power-supply devices 1a to 1e; setting the step-up ratio for each of the voltage transducers 3a to 3e; controlling the voltage measuring devices 4a to 4e and reading out measurements therefrom; making settings of the inverter 6; controlling the switches 7a, 7b; and performing ON/OFF control of the load 9.

In Embodiment 1, the path of the control signal 11 for controlling the components by the controller 103 is indicated by the solid line of FIG. 1. Here, the control signal may be transmitted through wired or wireless communication.

Next, a configuration and an operation of the load connecting part 104 are described. The load connecting part 104, which is not included in the disclosed power-supply device determination apparatus 100, is included in the disclosed power conversion apparatus 105. The load connecting part 104 includes the inverter 6 for converting DC power supplied from the voltage measuring part 102, and a load connection terminal 8a for connecting the output of the inverter 6 to the load 9.

The inverter 6 converts power from the voltage measuring part 102 into 200 V AC single-phase 3-wire corresponding to the load 9. The power thus converted into 200 V AC single-phase 3-wire is supplied to the load 9 connected to the load connection terminal 8a. The inverter 6 converts the power into optimum power corresponding to the connected load as described above, based on the control signal 11 from the controller 103.

The load connection terminal 8a may include, in addition to the power terminal for inputting/outputting power to and from the load 9, a control signal terminal for allowing the controller 103 to control the load 9. In Embodiment 1, the load connection terminal 8a is connected with the load 9 which operates at 200 V AC single-phase 3-wire. Here, the load 9 is driven at 100 V AC which is supplied through 2 wires including a neutral-phase wire taken out from among the single-phase 3-wire of 200 V AC. Examples of the load 9 may include electric appliances such as a refrigerator, emergency light, a hot water system, and a domestic network server, in which the occurrence of power failure must be kept to a minimum, and may also include a general home-use load such as a hair dryer, a home video game, and a music audio system.

To supply power to the load 9, the switches 7a and 7b are switched as illustrated in FIG. 1 so that the load 9 may be selectively supplied with power from a commercial power grid 10 connected to the load connection terminal 8b and power from the inverter 6. The switching is performed based on, for example, output voltages of the commercial power grid 10 and the inverter 6 monitored by the controller 103.

Next, description is individually given in below of a device determination mode for determining the types of the power-supply devices, and a steady operation mode that follows, of Embodiment 1.

(Operation of Device Determination Mode)

In the device determination mode, the voltage transducers 3a to 3e in the power-supply device connecting part 101 step up, at the same step-up ratio, the output voltages of the power-supply devices 1a to 1e. In Embodiment 1, the output voltages of the power-supply devices 1a to 1e are sequentially stepped up by the same step-up ratio of 1.2, and the output voltages thus stepped up are input to the voltage measuring devices 4a to 4e. The step-up ratio in the device determination mode may be set to an arbitrary value of 1 or more and 2 or less.

Figure 2:
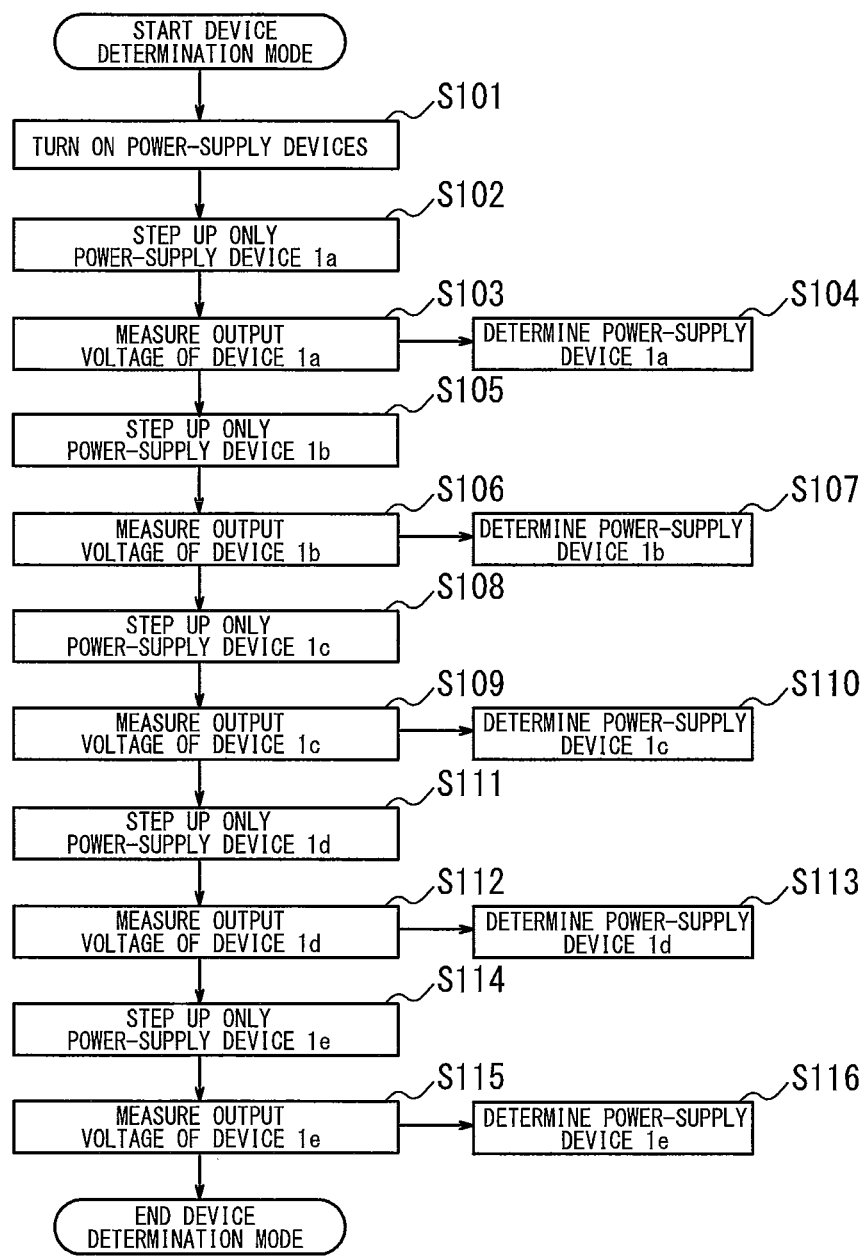
FIG. 2 is a flowchart illustrating an operation procedure of the device determination mode of the disclosed power-supply device determination apparatus of Embodiment 1.

FIG. 2 illustrates, in a flowchart, a procedure for determining the power-supply devices in Embodiment 1. First, the controller 103 of the power-supply device determination apparatus 100 turns ON the power-supply devices 1a to 1e, after the device determination mode is started (Step S101). Next, the controller 103 causes the voltage transducer 3a to step up only the output voltage of the power-supply device 1a (Step S102). At this time, the voltage transducers 3b to 3e are not operated, and the voltage transducers 3b to 3e are each open on the input side of the inverter 6. Accordingly, the outputs of the voltage transducers 3b to 3e do not affect the output voltage of the voltage transducer 3a and the measurement result obtained by the voltage measuring device 4a. The controller 103, after stepping up the voltage in Step S102, causes the voltage measuring device 4a to measure the output voltage thus stepped up of the power-supply device 1a (Step S103). The controller 103 determines, based on the measurement result of the output voltage, the power-supply device 1a (Step S104).

Figure 3:
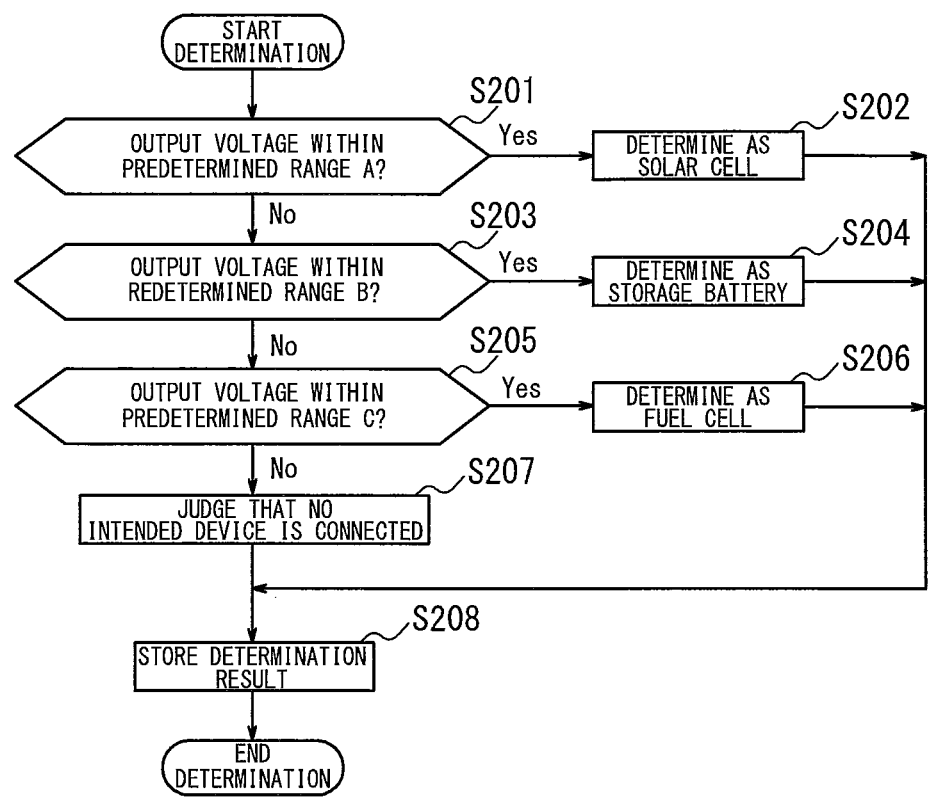
FIG. 3 is a flowchart illustrating a procedure for determining a power-supply device based on the output voltage thereof, in the disclosed power-supply device determination apparatus of Embodiment 1.

FIG. 3 illustrates in detail, in a flowchart, a procedure for determining the power-supply devices 1a to 1e in Step S104. Once the determination is started, the controller 103 determines whether the output voltage of the voltage transducer 3a measured by the voltage measuring device 4a falls within the predetermined range A shown in Table 1 (Step S201). When the controller 103 has judged that the voltage falls within the predetermined range A, the power-supply device 1a is determined as a "solar cell" (Step S202). The controller 103 stores, in a memory 12 in the controller 103, the determination result on the power-supply device 1a (Step S208), and ends the determination.

TABLE 1

| Predetermined Range Classification | Output Voltage [V] |
| --- | --- |
| Predetermined Range A | 240 ± 30 |
| Predetermined Range B | 190 ± 10 |
| Predetermined Range C | 160 ± 10 |

Next, the controller 103 causes the voltage transducer 3b to step up only the output voltage of the power-supply device 1b (Step S105). As in Step S102, the voltage transducers 3a and 3c to 3e are not operated, and the voltage transducers 3a and 3c to 3e are each open on the input side of the inverter 6. Accordingly, the outputs of the voltage transducers 3a and 3c to 3e do not affect the output voltage of the voltage transducer 3b and the measurement result obtained by the voltage measuring device 4b. The same applies when determining the power-supply devices 1c to 1e described in below. The controller 103, after stepping up the voltage in Step S105, causes the voltage measuring device 4b to measure the output voltage thus stepped up of the power-supply device 1b (Step S106), and determines the power-supply device 1b based on the measurement result (Step S107).

The controller 103 determines whether the output voltage of the voltage transducer 3b measured by the voltage measuring device 4b falls within the predetermined range A shown in Table 1 (Step S201). When the controller 103 has judged that the voltage falls within the predetermined range A, the power-supply device 1a is determined as a "solar cell" (Step S202). The controller 103 then stores, in the memory 12 therein, the determination result on the power-supply device 1b (Step S208), and ends the determination. The power-supply device 1c is also determined as a "solar cell" by the same procedure as described above.

Next, the controller 103 causes the voltage transducer 3d to step up only the output voltage of the power-supply device 1d (Step S111). As in Step S102, the voltage transducers 3a to 3c, and 3e are not operated, and the voltage transducers 3a to 3c, and 3e are each open on the input side of the inverter 6. Accordingly, the outputs of the voltage transducers 3a to 3c, and 3e do not affect the output voltage of the voltage transducer 3d and the measurement result obtained by the voltage measuring device 4d. The controller 103, after stepping up the voltage in Step S111, causes the voltage measuring device 4d to measure the output voltage thus stepped up of the power-supply device 1d (Step S112), and determines the power-supply device 1d based on the measurement result (Step S113).

The controller 103 determines whether the output voltage of the voltage transducer 3d measured by the voltage measuring device 4d falls within the predetermined range A shown in Table 1 (Step S201), and having judged that the voltage falls out of the predetermined range A, the controller 103 then determines whether the voltage falls within the predetermined range B (Step S203). When the controller 103 has judged that the voltage falls out of the predetermined range B, the controller 103 then determines whether the voltage falls within the predetermined range C (Step S205). When the controller 103 has judged that the voltage falls within the predetermined range C, the power-supply device 1d is determined as a "fuel cell" (Step S206), and the determination result on the power-supply device 1d is stored in the memory 12 in the controller 103 (Step S208) to end the determination. Here, in Step S205, if the voltage is judged to fall out of the predetermined range C, the controller 103 determines that none of the intended power-supply devices is connected (Step S207), and stores the determination result in the memory 12 in the controller 103 (Step S208) to end the determination.

Next, the controller 103 causes the voltage transducer 3e to step up only the output voltage of the power-supply device 1e (Step S114). As in Step S102, the voltage transducers 3a to 3d are not operated, and the voltage transducers 3a to 3d are open on the input side of the inverter 6, so that the outputs of the voltage transducers 3a to 3d do not affect the output voltage of the voltage transducer 3e and the measurement result to be obtained by the voltage measuring device 4e. The controller 103, having stepped up the voltage in Step S114, causes the voltage measuring device 4e to measure the output voltage thus stepped up of the power-supply device 1e (Step S115), and determines the power-supply device 1e based on the measurement result (Step S116).

The controller 103 determines whether the output voltage of the voltage transducer 3e obtained as the measurement result of the voltage measurement device 4e falls within the predetermined range A shown in table 1 (Step S201). The controller 103, having judged that the voltage falls out of the predetermined range A, then determines whether the voltage falls within the predetermined range B (Step S203). Here, the controller 103, having judged that the voltage falls within the predetermined range B, determines that the power-supply device 1e is a "storage battery" (Step S204), and stores the determination result on the power-supply device 1e in the memory 12 in the controller 103 (Step S208) to end the determination.

When completed the determination on all the power-supply devices, the controller 103 ends the device determination mode. Referring to Table 1, the predetermined range A, which corresponds to the output voltage of solar cells, is set wider than the predetermined range B, which corresponds to storage batteries, and the predetermined range C, which corresponds to fuel cells, because the output of solar cells is susceptible to variation due to the variation of solar irradiance.

(Operation of Steady Operation Mode)

Next, a steady operation mode of Embodiment 1 is described in below. To illustrate the steady operation mode, the operation of the entire power conversion apparatus 105 including the control of the load connecting part 104 and of the load 9 is explained.

Figure 4:
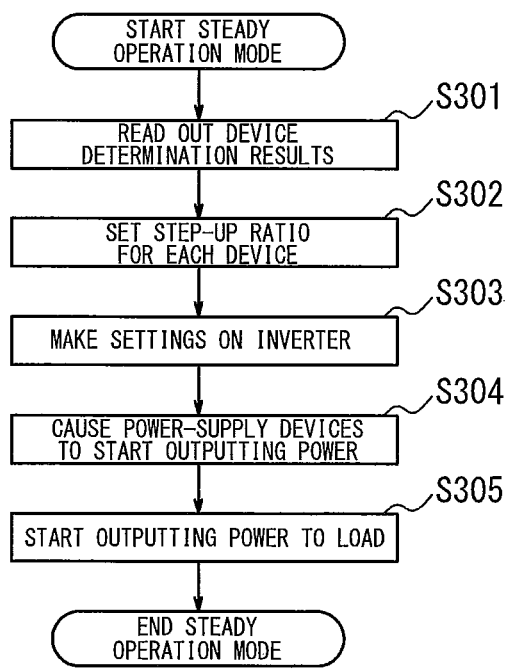
FIG. 4 is a flowchart illustrating an operation procedure of a steady operation mode of the disclosed power-supply device determination apparatus of Embodiment 1.

In the steady operation mode, the voltage transducers 3a to 3e in the power-supply device connecting part 101 each step up the output voltage at an individual step-up ratio corresponding to the respective one of the power-supply devices 1a to 1e, based on the result of determination made in the device determination mode. FIG. 4 illustrates, in a flowchart, an operation procedure in the steady operation mode of Embodiment 1.

In FIG. 4, when the steady operation mode is started, the controller 103 reads out, from the memory 12 in the controller 103, the device determination results obtained through the device determination mode (Step S301). Based on the device determination results thus read out, the controller 103 sets the step-up ratios shown in Table 2 to the voltage transducers 3a to 3e (Step S302). For example, the determination results on the power-supply devices 1a to 1c read out in Step S301 all indicate "solar cells", and thus the controller 103 refers to the correspondence table of Table 2 to set the step-up ratio of 1.25 to the voltage transducers 3a to 3c corresponding to the power-supply devices 1a to 1c. Similarly, the determination results on the power-supply device 1d read out in Step S301 indicates "fuel cell", and thus the controller 103 refers to the correspondence table of Table 2 to set the step-up ratio of 1.88 to the voltage transducer 3d corresponding to the power-supply device 1d. Further, the determination results on the power-supply device 1e read out in Step S301 indicates "storage battery", and thus the controller 103 refers to the correspondence table of Table 2 to set the step-up ratio of 1.58 to the voltage transducer 3e corresponding to the power-supply device 1e.

The voltage transducers 3a to 3e set with the aforementioned step-up ratios may theoretically provide, as the output voltage of each of the power supply devices, 300 V DC corresponding to the DC link voltage.

TABLE 2

| Power-Supply Device | Step-up Ratio |
| --- | --- |
| Solar Cell | 1.25 |
| Fuel Cell | 1.88 |
| Storage Battery | 1.58 |

Next, the controller 103 makes settings on the inverter 6 so that inverter 6 converts the input power of 300 V DC into power of 200 V AC single-phase (Step S303). As illustrated in FIG. 1, the inverter 6, the switches 7a, 7b, and the load connection terminals 8a, 8b are illustrated as being included in the power conversion apparatus, rather than in the disclosed power-supply device determination apparatus in Embodiment 1. However, the inverter 6, the switches 7a, 7b, and the load connection terminals 8a, 8b may be included in the power-supply device determination apparatus.

Next, the controller 103 causes the power-supply devices 1a to 1 e to start outputting power therefrom (Step S304), while confirming that the voltage transducers 3a to 3e are each outputting power of approximately 300 V DC. The output powers from the voltage transducers 3a to 3e are DC-linked and input to the inverter 6. The controller 103 also monitors the voltage having passed through the inverter 6 to confirm that the voltage of predetermined 200 V AC is being obtained, and then turns ON the switch 7a to start supplying power to the load 9 (Step S305).

The controller 103 may be configured as hardware, or may be implemented as a program to be executed by a CPU to realize the functions thereof.

In Embodiment 1, the output voltages of the voltage transducers 3a to 3e are each measured by the individual one of the voltage measuring devices 4a to 4e, respectively. However, without being limited thereto, the voltage measuring device 4 may be provided alone as a single device. That is, the controller 103 may use a multiplexer to switch the outputs to the voltage measuring device 4 at the timings of Steps S103, S106, S109, S112, S115 of FIG. 2, so as to allow the voltage measuring device 4 to sequentially measure the output voltages of the voltage transducers 3a to 3e.

The inverter 6 of Embodiment 1 has the output voltage controlled by the controller 103, which however is not limited thereto, and may be set up to have a predefined output voltage.

In Embodiment 1, the load connection terminal 8a outputs, as AC power output, 200 V AC single-phase 3-wire. However, without being limited thereto, an inverter 6' may be disposed in place of the inverter 6 to convert power into 200 V three-phase in order to support service refrigerators and air conditioners, and driving of motors in factories.

Embodiment 1 is illustrated by assuming, as the loads to be connected, electric appliances designed for domestic use in Japan, which may be modified as appropriate in consideration of the use of electric appliances available overseas. For example, the controller 103 may control the inverter 6 to output 220 V to 240 V AC, or the inverter 6 may be replaced by an inverter 6" capable of outputting 220 V to 240 V AC. This configuration allows for connecting electric appliances available in Asian, Oceanian, and European regions.

As described above, according to Embodiment 1 disclosed herein, the types of the power-supply devices connected are automatically determined in the device determination mode, and based on the determination result, the step-up ratio with respect to the output powers of the power-supply devices are automatically set in the steady operation mode. With this configuration, the user is no longer required to check the individual types of the power-supply devices connected or to manually set the DC/DC converters to step up the output voltage at the step-up ratio corresponding to the type of the device. Further the voltage of the power-supply device is always monitored even during the steady operation, and the voltage measuring devices 4a to 4e measuring the voltage are used to determine the types of the power-supply devices. Accordingly, without additionally providing any special circuit, the power-supply device can be determined.

Embodiment 2

Figure 5:
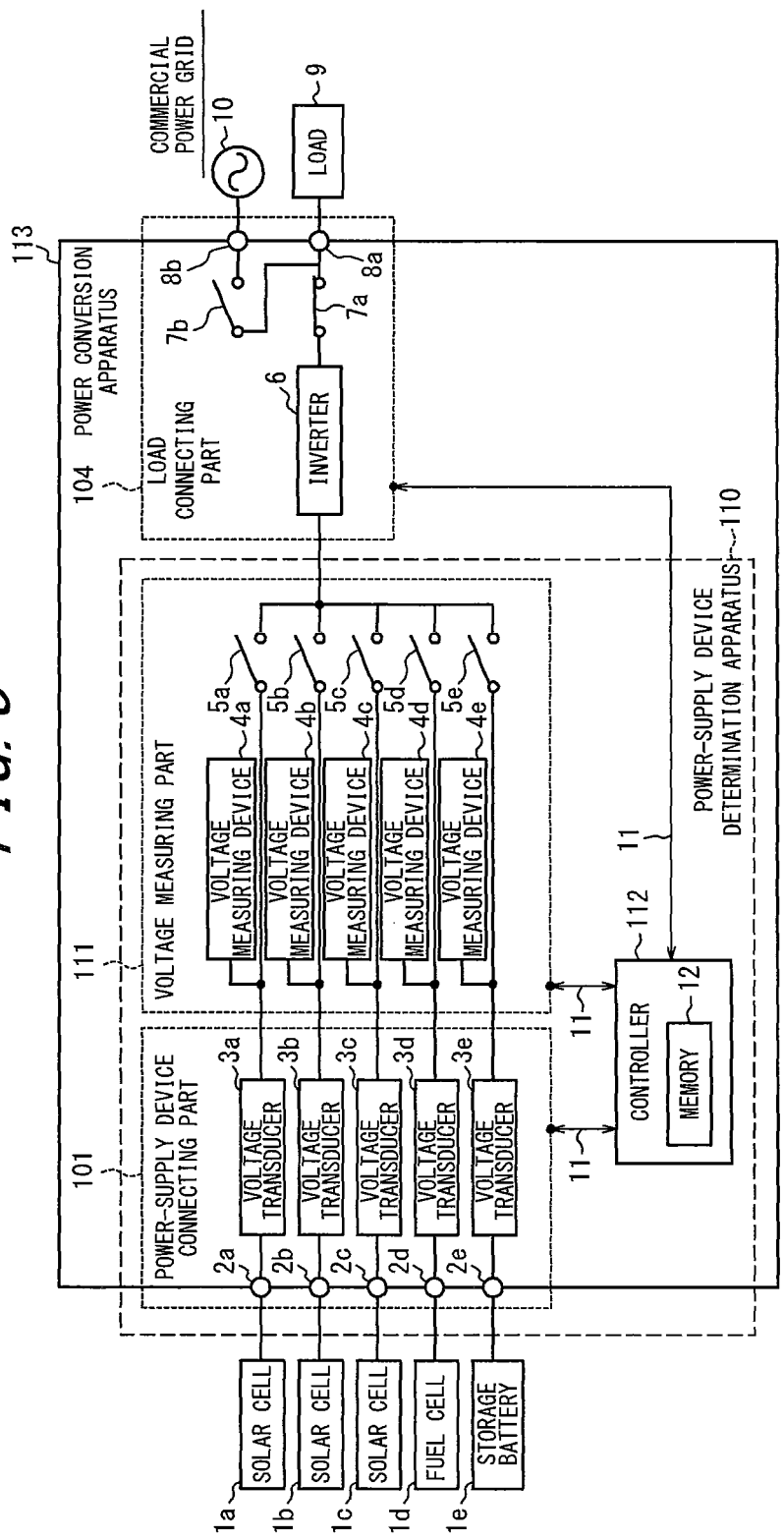
FIG. 5 is a block diagram illustrating a configuration of the disclosed power-supply device determination apparatus and power conversion apparatus of Embodiment 2.

FIG. 5 is a block diagram illustrating a configuration of a power conversion apparatus 113 including a power-supply device determination apparatus 110 according to Embodiment 2 disclosed herein. The power-supply device determination apparatus 110 of Embodiment 2 includes: the power-supply device connecting part 101 for connecting a plurality of power-supply devices; a voltage measuring part 111 for measuring output voltages from the power-supply devices; and a controller 112 for controlling the respective components. The power conversion apparatus 113 further includes the load connecting part 104 for connecting to loads.

The power-supply device connecting part 101 and the load connecting part 104 are similar in configuration to those of Embodiment 1 disclosed herein, and thus a redundant detailed description thereof will be omitted. Here, description is given of the voltage measuring part 111 and the controller 112 that are different in configuration from those of Embodiment 1.

First, a configuration and an operation of the voltage measuring part 111 are described. The voltage measuring part 111 includes the voltage measuring devices 4a to 4e for measuring the voltages of DC powers output from the voltage transducers 3a to 3e. Further, in Embodiment 2, The voltage measuring part 111 further includes gang switches 5a to 5e disposed in a subsequent stage of the voltage transducers 3a to 3e and in a preceding stage of the inverter 6. The gang switches 5a to 5e are controlled by the controller 112, and turned OFF during the device determination mode, so that the stepped up output voltages of the power-supply devices can be individually monitored. Meanwhile, the gang switches 5a to 5e are controlled to be turned ON during the steady operation mode, so that the outputs of the power-supply devices are DC-linked in a preceding stage of the inverter 6 and then input to the inverter 6.

Next, a configuration and an operation of the controller 112 are described. The controller 112 is capable of communicating, through the control signal 11 of FIG. 5, with the power-supply devices 1a to 1e, the voltage transducers 3a to 3e, the voltage measuring devices 4a to 4e, the gang switches 5a to 5e, the inverter 6, the switches 7a, 7b, and the load 9, so as to perform various controls on the components. Specifically, the controller 112 is capable of, for example: performing ON/OFF control of the power-supply devices 1a to 1e; setting the step-up ratio for each of the voltage transducers 3a to 3e; controlling the voltage measuring devices 4a to 4e and reading out measurements therefrom; controlling the gang switches 5a to 5e; making settings of the inverter 6; controlling the switches 7a, 7b; and performing ON/OFF control of the load 9.

Next, description is individually given in below of a device determination mode for determining the types of the power-supply devices, and a steady operation mode that follows, of Embodiment 2.

(Operation of Device Determination Mode)

In the device determination mode, the voltage transducers 3a to 3e in the power-supply device connecting part 101 step up, at the same step-up ratio, output voltages of the power-supply devices 1a to 1e. In Embodiment 2, output voltages of the power-supply devices 1a to 1e are sequentially stepped up by the same step-up ratio of 1.2, and the output voltages thus stepped up are input to the voltage measuring devices 4a to 4e. The step-up ratio in the device determination mode may be set to an arbitrary value of 1 or more and 2 or less.

Figure 6:
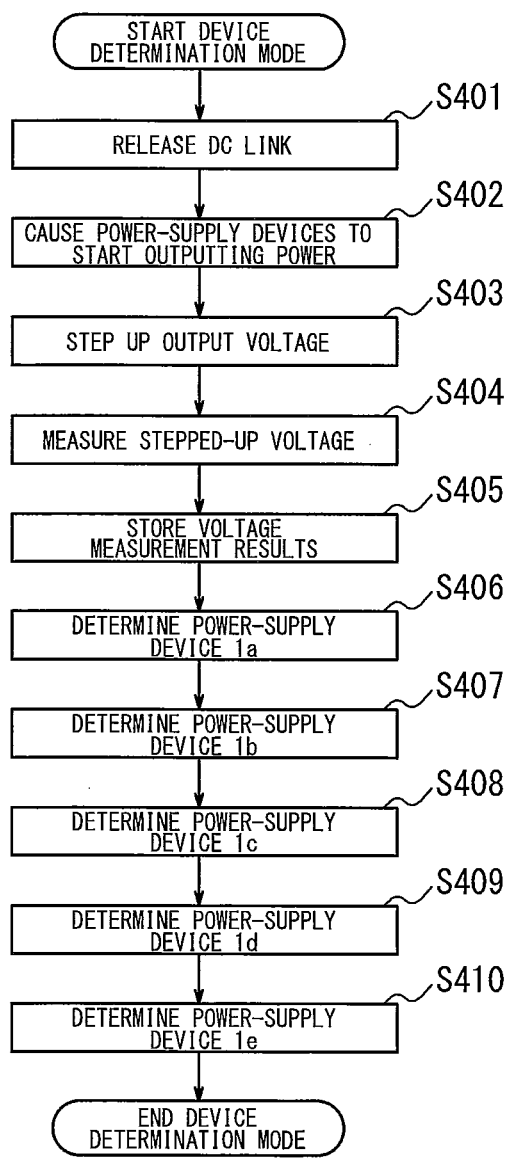
FIG. 6 is a flowchart illustrating an operation procedure of a device determination mode of the disclosed power-supply device determination apparatus according Embodiment 2.

FIG. 6 illustrates, in a flowchart, a procedure for determining the power-supply devices in Embodiment 2. The controller 112 of the power-supply device determination apparatus 110 first turns OFF the gang switches 5a to 5e, after the device determination mode is started, so as to release the DC link between the output powers from the voltage transducers 3a to 3e (Step S401). Next, the controller 112 turns ON the outputs of the power-supply devices 1a to 1e all together (Step S402), and causes the voltage transducers 3a to 3e to step up the output powers of the power-supply devices 1a to 1e (Step S403). The controller 112, having stepped up the voltages in Step S403, causes the voltage measuring devices 4a to 4e to measure the output voltages thus stepped up of the power-supply devices 1a to 1e (Step S404), and stores the measurement results in the memory 12 in the controller 112 (Step S405). The controller 112 determines, based on the measurement result of the output voltage thus stored, the power-supply devices 1a to 1e (Steps S406 to S410) to end the device determination mode.

Figure 7:
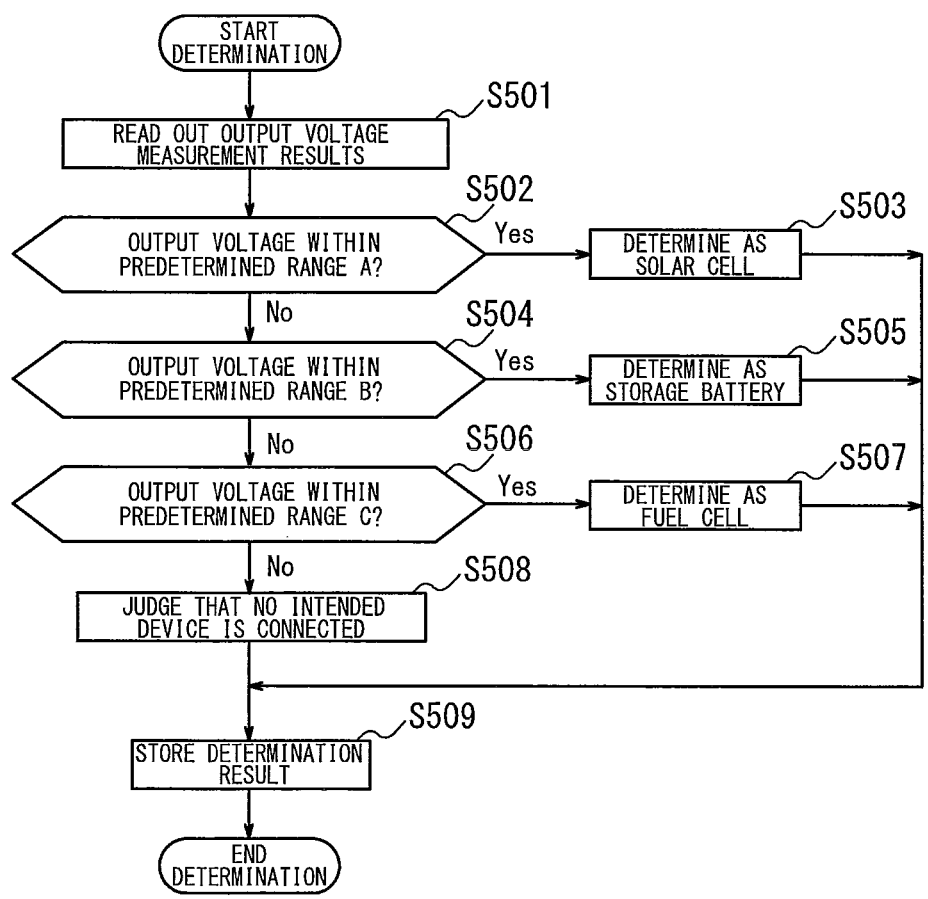
FIG. 7 is a flowchart illustrating a procedure for determining a power-supply device based on the output voltage thereof, in the disclosed power-supply device determination apparatus according Embodiment 2.

Next, FIG. 7 illustrates in detail, in a flowchart, a procedure for determining the power-supply devices 1a to 1e in Steps S406 to S410. Once the determination is started, the controller 112 reads out the corresponding output voltage determination result stored in the memory 12 (Step S501). Next, the controller 112 determines whether the output voltage determination result thus read out falls within the predetermined range A shown in Table 1 (Step S502). When the output voltage is judged to fall within the predetermined range, the power-supply device is determined as "solar cell" (Step S503). The controller 112 stores, in the memory 12 in the controller 112, the determination result on the power-supply device 1a (Step S509) to end the determination. When the output voltage is judged to fall out of the predetermined range A, the controller 112 then judges whether the output voltage measurement results thus read out falls within the predetermined range B shown in Table 1 (Step S504). When the controller 112 has judged that the output voltage falls within the predetermined range B, the power-supply device is determined as a "storage battery" (Step S505), and the determination result on the power-supply device is stored in the memory 12 in the controller 112 (Step S509) to end the determination. When the voltage is judged to fall out of the predetermined range B, the controller 112 then judges whether the output voltage measurement result thus read out falls within the predetermined range C shown in Table 1 (Step S506). When the controller 112 has judged that the voltage falls within the predetermined range C, the power-supply device is determined as a "fuel cell" (Step S507), and the determination result on the power-supply device is stored in the memory 12 in the controller 112 (Step S509) to end the determination. Here, when the output voltage measurement result thus read out falls out of any of the predetermined ranges A to C, the controller 112 judges that no intended device is connected (Step S508), and stores the determination result on the power-supply device in the memory 12 in the controller 112 (Step S509) to end the determination.

When completed the determination on all the power-supply devices, the controller 112 ends the device determination mode.

(Operation of Steady Operation Mode)

Next, a steady operation mode of Embodiment 2 is described in below. To illustrate the steady operation mode, the operation of the entire power conversion apparatus 113 including the control of the load connecting part 104 and of the load 9 is explained.

Figure 8:
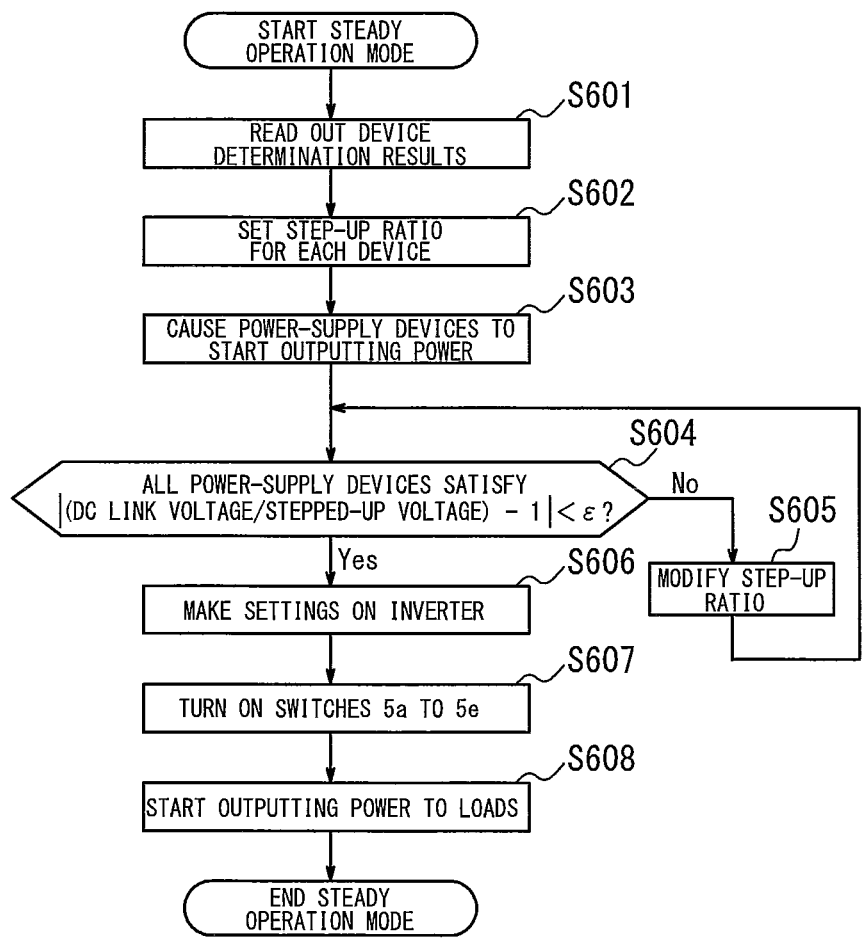
FIG. 8 is a flowchart illustrating an operation procedure of a steady operation mode of the disclosed power-supply device determination apparatus of Embodiment 2.

In the steady operation mode, the voltage transducers 3a to 3e in the power-supply device connecting part 101 each step up the output voltage at an individual step-up ratio corresponding to the respective one of the power-supply devices 1a to 1e, based on the determination results obtained in the device determination mode. FIG. 8 illustrates, in a flowchart, an operation procedure in the steady operation mode of Embodiment 2.

In FIG. 8, when the steady operation mode is started, the controller 112 reads out, from the memory 12 in the controller 112, the device determination results obtained through the device determination mode (Step S601). Based on the device determination results thus read out, the controller 112 sets the step-up ratios shown in Table 2 to the voltage transducers 3a to 3e (Step S602). For example, the determination results on the power-supply devices 1a to 1c read out in Step S601 all indicate "solar cells", and thus the controller 112 refers to the correspondence table of Table 2 to set the step-up ratio of 1.25 to the voltage transducers 3a to 3c corresponding to the power-supply devices 1a to 1c. Similarly, the determination results on the power-supply device 1d read out in Step S601 indicates "fuel cell", and thus the controller 103 refers to the correspondence table of Table 2 to set the step-up ratio of 1.88 to the voltage transducer 3d corresponding to the power-supply device 1d. Further, the determination results on the power-supply device 1e read out in Step S601 indicates "storage battery", and thus the controller 112 refers to the correspondence table of Table 2 to set the step-up ratio of 1.58 to the voltage transducer 3e corresponding to the power-supply device 1e. The voltage transducers 3a to 3 set with the aforementioned step-up ratios will theoretically provide the output voltage of about 300 V DC.

Next, the controller 112 starts outputting powers from the power-supply devices (Step S603). Here, the power from the power-supply device 1a is explained by way of example. The controller 112 calculates the ratio of DC link voltage Vd (300 V in Embodiment 2) to the stepped-up output voltage Vac of the power-supply device 1a, and confirms that the ratio satisfies Expression (1) with respect to a predetermined threshold value ε (Step S604). When the ratio fails to satisfy Expression (1), the step-up ratio predefined in Step S602 is modified (Step S605). Specifically, the step-up ratio is modified so as to obtain the step-up ratio Rad represented by Expression (2) where Rad represents the original step-up ratio and Rac represents the modified step-up ratio. The aforementioned procedure is continued until the stepped-up output voltages Vac to Vec of all the power-supply devices satisfy Expression (1). The suffix "a" in Expressions (1), (2) indicates that Expressions show the relation about the power-supply device 1a; the suffix "a" may be replaced by each of "b" to "e" when Expression relates to the power-supply devices 1b to 1e, respectively.

$$|Vd/Vac-1|<\varepsilon \qquad \text{Expression (1)}$$

$$Rad=Rac \times Vd/Vac \qquad \text{Expression (2)}$$

Next, the controller 112 makes settings on the inverter 6 so that inverter 6 converts the input power of 300 V DC into power of 200 V AC single-phase (Step S606). As illustrated in FIG. 5, the inverter 6, the switches 7a, 7b, and the load connection terminals 8a, 8b are illustrated as being included in the disclosed power conversion apparatus, rather than in the disclosed power-supply device determination apparatus in Embodiment 2. However, the inverter 6, the switches 7a, 7b, and the load connection terminals 8a, 8b may be included in the power-supply device determination apparatus.

Next, the controller 112 turns ON the gang switches 5a to 5e to monitor the voltage having passed through the inverter 6. Then, after confirming that the voltage of predetermined 200 V AC is being obtained, the controller 112 turns ON the switch 7a to start supplying power to the load 9 (Step S608).

As described above, in Embodiment 2 disclosed herein, the gang switches 5a to 5e are disposed in a subsequent stage of the voltage transducers 3a to 3e, and the gang switches 5a to 5e are configured to be turned OFF during the device determination mode. With this configuration, the voltage transducers 3a to 3e may be simultaneously stepped up without causing interference among the output powers, expediting the process of the power-supply device determination. Further, Embodiment 2 is configured to modify the step-up ratio based on the ratio between the stepped-up output voltage of the power-supply device and the DC link voltage. This configuration allows for automatically modifying the step-up ratio, for example, when the output voltage of a solar cell varies due to the variation of solar irradiance, which contributes to obtaining the stable DC link voltage.

Embodiment 3

Next, description is given of the power conversion apparatus 113 including the power-supply device determination apparatus 110 of Embodiment 3 disclosed herein. Embodiment 3 is different from Embodiments 1 and 2 in operation of the controller 112, but identical with Embodiment 2 in hardware configuration. Therefore, in the following description, the configuration of Embodiment 3 is described with reference to the block diagram of FIG. 5.

In below, description is individually given of a device determination mode for determining the types of the power-supply devices, and a steady operation mode that follows, of Embodiment 3.

(Operation of Device Determination Mode)

In the device determination mode, the voltage transducers 3a to 3e in the power-supply device connecting part 101 step up, at the same step-up ratio, the output voltages of the power-supply devices 1a to 1e. In Embodiment 3, the output voltages of the power-supply devices 1a to 1 e are stepped up at the same step-up ratio of 1.2, and the output voltages thus stepped up are input to the voltage measuring devices 4a to 4e. The step-up ratio in the device determination mode may be set to an arbitrary value of 1 or more and 2 or less.

Figure 9:
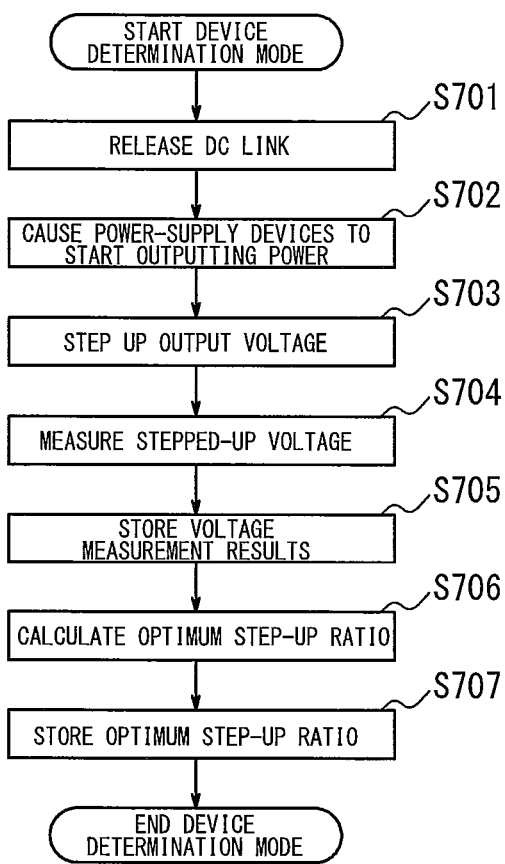
FIG. 9 is a flowchart illustrating an operation procedure of a device determination mode of the disclosed power-supply device determination apparatus according Embodiment 3.

FIG. 9 illustrates, in a flowchart, a procedure for determining the power-supply devices in Embodiment 3. The controller 112 of the power-supply device determination apparatus 110 first turns OFF the gang switches 5a to 5e, after the device determination mode is started, so as to release the DC link between the output powers from the voltage transducers 3a to 3e (Step S701). Next, the controller 112 turns ON the outputs of the power-supply devices 1a to 1e all together (Step S602), and causes the voltage transducers 3a to 3e to step up the output powers of the power-supply devices 1a to 1e (Step S703). The controller 112, having stepped up the voltage in Step S703, causes the voltage measuring devices 4a to 4e to measure the output voltage thus stepped up of the power-supply devices 1a to 1e (Step S704). The controller 112 stores the measurement results of the output voltages, in the memory 12 in the controller 112 (Step S705).

Next, the controller 112 calculates an optimum step-up ratio for each of the power-supply devices 1a to 1 e, based on the output voltage measurement result thus stored. More specifically, for example, when the power-supply device 1a has the stepped-up output voltage of Vaf at the step-up ratio Rf in Step S703, the controller 112 calculates the optimum step-up ratio of the power-supply device 1a from Expression (3) in which the DC link voltage Vd is used. The suffix "a" in Expression (3) indicates that Expression (3) shows the relation about the power-supply device 1a; when Expression (3) relates to each of the power-supply devices 1b to 1e, the suffix "a" may be replaced by "b" to "e", respectively.

$$Rad=Rf \times Vd/Vaf \qquad \text{Expression(3)}$$

The controller 112 calculates the optimum step-up ratios Rad to Red for all the power-supply devices 1a to 1e (Step S706), and stores the calculation results in the memory 12 in the controller 112 (Step S707) to end the device determination mode thereafter.

(Operation of Steady Operation Mode)

Next, a steady operation mode of Embodiment 3 is described in below. To illustrate the steady operation mode, the operation of the entire power conversion apparatus 113 including the control of the load connecting part 104 and of the load 9 is explained.

Figure 10:
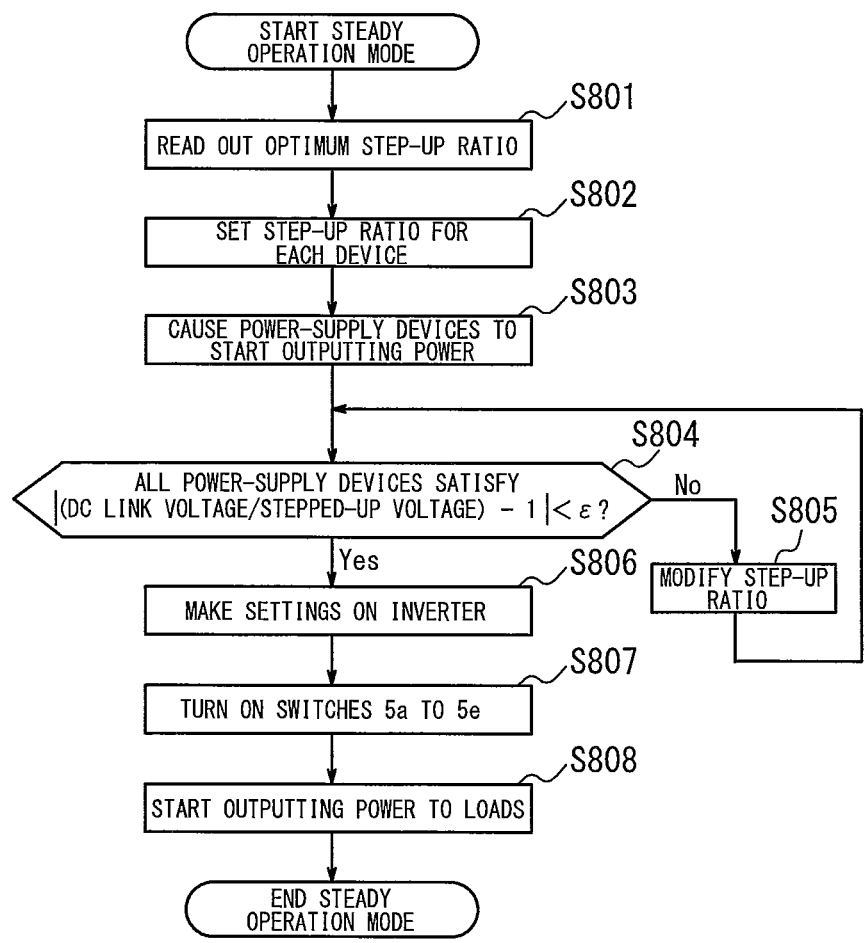
FIG. 10 is a flowchart illustrating an operation procedure of a steady operation mode of the disclosed power-supply device determination apparatus of Embodiment 3.

In the steady operation mode, the voltage transducers 3a to 3e in the power-supply device connecting part 101 each step up the output voltage at the individual optimum step-up ratio corresponding to the respective one of the power-supply devices 1a to 1e, based on the determination results obtained in the device determination mode. FIG. 10 illustrates, in a flowchart, an operation procedure in the steady operation mode of Embodiment 3.

In FIG. 10, when the steady operation mode is started, the controller 112 reads out, from the memory 12 in the controller 112, the calculation results on the optimum step-up ratio for each of the devices obtained through the device determination mode (Step S801). Based on the calculation results thus read out, the controller 112 sets the optimum step-up ratios to the voltage transducers 3a to 3e (Step S802). The voltage transducers 3a to 3e set with the optimum step-up ratios will theoretically provide the output voltage corresponding to the DC link output voltage.

Next, the controller 112 starts outputting powers from the power-supply devices (Step S803). Here, the power from the power-supply device 1a is explained by way of example. The controller 112 calculates the ratio of DC link voltage Vd (300 V in Embodiment 3) to the stepped-up output voltage Vac of the power-supply device 1a, and confirms that the ratio satisfies Expression (1) with respect to a predetermined threshold value ε (Step S804). When the ratio fails to satisfy Expression (1), the step-up ratio is modified (Step S805). Specifically, the step-up ratio is modified so as to obtain the step-up ratio Rad represented by Expression (2) where Rad represents the original step-up ratio and Rac represents the modified step-up ratio. The aforementioned operation is continued until the stepped-up output voltages Vac to Vec of all the power-supply devices 1a to 1e satisfy Expression (1).

Next, the controller 112 makes settings on the inverter 6 so that inverter 6 converts the input power of 300 V DC into power of 200 V AC single-phase (Step S806). As illustrated in FIG. 5, the inverter 6, the switches 7a, 7b, and the load connection terminals 8a, 8b are illustrated as being included in the disclosed power conversion apparatus, rather than in the disclosed power-supply device determination apparatus in Embodiment 2. However, the inverter 6, the switches 7a, 7b, and the load connection terminals 8a, 8b may be included in the power-supply device determination apparatus.

Next, the controller 112 turns ON the gang switches 5a to 5e (Step S807) to monitor the voltage having passed through the inverter 6. Then, after confirming that the voltage of predetermined 200 V AC is being obtained, the controller 112 turns ON the switch 7a to start supplying power to the load 9 (Step S808).

Figure 11:
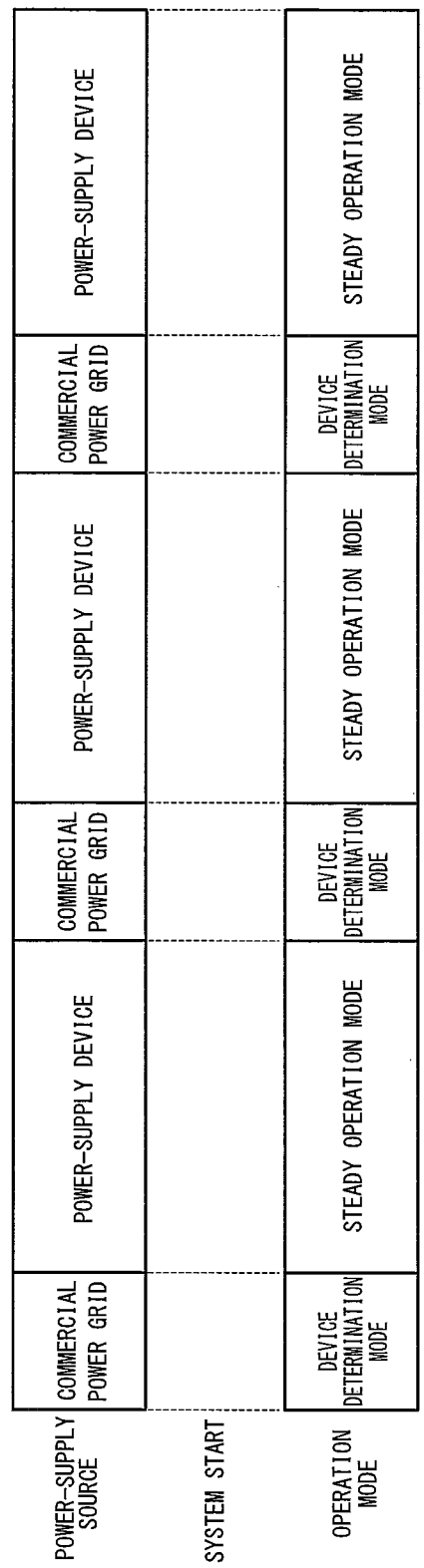
FIG. 11 shows transition from the device determination mode to the steady operation mode in the disclosed power-supply device determination apparatus of Embodiment 3.

The device determination mode and the steady operation mode illustrated in FIGS. 9 and 10 may be repeated. Specifically, as illustrated in FIG. 11, the device determination mode may periodically be performed even after the device determination mode is shifted to the steady operation mode, so as to set the step-up ratio based always on the latest output voltages of the power-supply devices. During the device determination mode, the switch 7a may be turned OFF while the switch 7b may be turned ON to supply power to the load from the commercial power grid 10 as illustrated in FIG. 11 so as not to stop the power supply.

As described above, Embodiment 3 disclosed herein is configured to calculate the optimum step-up ratio, based on the ratio between the output voltage obtained at the fixed step-up ratio and the DC link voltage, to thereby maintain the same output voltage as the known power-supply device even if unknown power-supply device is connected, which may expand the application range of power-supply devices in future.

In Embodiments 1 to 3 disclosed herein, during the steady operation mode, power is always supplied only from the power-supply devices, but the present disclosure is not limited thereto. The switch 7b may be turned ON as appropriate depending on the excess and shortage of the power supply from the power-supply devices, so as to be connected to the commercial power grid.

The present disclosure has been explained with reference to various drawings and Examples, but it should be noted that a person skilled in the art should readily conceive of various modifications and alterations based on the disclosure. Therefore, such modifications and alterations all fall within the scope of the present disclosure. For example, functions included in the members, the units, and the steps may be re-arranged as long as being theoretically compatible, and a plurality of units and steps may be combined into one or may be divided.

Multiple aspects of the present disclosure are illustrated as a series of operations to be executed by a computer system or other hardware capable of executing program instructions. Examples of the computer system and the other hardware may include, for example, a general purpose computer, a personal computer (PC), a dedicated computer, a workstation, a Personal Communications System (PCS), an RFID receiver, an electrical notepad, a laptop computer, a Global Positioning System (GPS) receiver, and other programmable data processing devices. Note that, in each Embodiment, various operations may be executed through a dedicated circuit installed with program instructions (software) (for example, individual logic gates mutually connected to execute specific functions) or through a logical block or a program module executed by one or more processors. Examples of the one or more processors for executing the logic block and the program module may include, for example, one or more microprocessors, central processing units (CPU), Application Specific Integrated Circuits (ASIC), Digital Signal Processors (DSP), Programmable Logic Devices (PLD), Field Programmable Gate Arrays (FPGA), processors, controllers, microcontrollers, microprocessors, electronic devices, and other devices designed to be capable of executing the functions described herein, and/or a combination of any of those. Embodiments disclosed herein may be implemented by, for example, hardware, software, farm ware, middle ware, a microcode, or a combination of any of those. The instructions may be a program code or a code segment to execute necessary tasks. The instructions may be stored in machine-readable non-temporary storage medium and other media. The code segment may indicate a function, a sub-program, a program, a routine, a sub-routine, a module, a software package, a class or an order, or an arbitrary combination of any of a data structure and a program statement. The code segment may transmit and/or receive information, data parameters, variables or stored content, to and from other code segment or a hardware circuit, to thereby connect the code segment to other code segments or hardware circuits.

The network used herein may include, unless otherwise specified, the Internet, an ad hoc network, a Local Area Network (LAN), a cellular network, Wireless Personal Area Network (WPAN), or other networks, or a combination of any of those. Wireless networks may include, for example, an access point (such as Wi-Fi access point) and a femtocell. Further, wireless communication equipment may be connected to, for example, Wi-Fi, Bluetooth (Registered Trademark), cellular communication technology (e.g., Code Division Multiple Access (CDMA), Time Division Multiple Access (TDMA), Frequency Division Multiple Access (FDMA), Orthogonal Frequency Division Multiple Access (OFDMA), Single-Carrier Frequency Division Multiple Access (SC-FDMA), and a wireless network using other wireless technology and/or technology standard.

The machine-readable non-temporary storage medium used herein may be configured as a computer-readable tangible carrier (medium) to be categorized as a solid state memory, a magnetic disk, and an optical disk, which stores an appropriate set of computer instructions and a data structure such as a program module for causing a processor to execute the technology disclosed herein. The computer-readable medium may include an electric link including at least one line, a magnetic disk storage medium, a magnetic cassette, a magnetic tape, and other magnetic and optical storage devices (such as, for example, a Compact Disk (CD), a laser disk (registered trademark), a Digital Versatile Disc (DVD) (registered trademark), a floppy (registered trademark) disk, and a blue ray disk (registered trademark)), a portable computer disk, a random access memory (RAM), a read-only memory (ROM), EPROM, EPROM, a rewritable and programmable ROM such as flash memory, and other tangible storage medium capable of storing information, and a combination of any of those. The memory may be disposed inside and/or outside the processor/processing unit. The term "memory" used herein refers to various kinds of long-term storage, short-term storage, volatile, non-volatile, and other memories, without being limited to any specific type or number or the type of the medium for storing the memory.

The system disclosed herein has various modules and/or units for executing specific functions, in which the modules and units are schematically illustrated in order for simply illustrating the functionality thereof, without necessarily indicating specific hardware and/or software. In this regard, these module, units, and other components may be hardware and/or software implemented to substantially execute the specific functions described herein. Various functions of different components may be implemented as hardware and/or software which may be combined or separated, and may be used individually or in combination of any of those. Further, a key board, a display, a touch screen, and a pointing device may be included, but not limited thereto, and input/output/or I/O device or a user interface may be connected to the system directly or via an I/O controller. As described above, the various aspects of the present disclosure may be implemented as various embodiments, which are all included in the scope of the present disclosure.

REFERENCE SIGNS LIST 1a to 1c power-supply device (solar cell)
1d power-supply device (fuel cell)
1e power-supply device (storage battery)
2a to 2e power-supply device connection terminal
3a to 3e voltage transducer
4a to 4e voltage measuring device
5a to 5e gang switch
6 inverter
7a, 7b switch
8a, 8b load connection terminal
9 load
10 commercial power grid
11 control signal
12 memory
100, 110 power-supply device determination apparatus
101 power-supply device connecting part
102, 111 voltage measuring part
103, 112 controller
104 load connecting part
105, 113 power conversion apparatus

The invention claimed is:

1. A power-supply device determination apparatus that can be connected with a plurality of power-supply devices, comprising: a plurality of connectors that can be connected with the plurality of power-supply devices; a plurality of voltage transducers connected in series with the plurality of connectors; a voltage measuring part configured to measure direct current (DC) output voltage values as output of each of the plurality of voltage transducers; and a controller configured to determine the plurality of power-supply devices, based on the DC output voltage values measured by the voltage measuring part when the plurality of voltage transducers have the same step-up ratio, wherein determining the plurality of power-supply devices comprises identifying types of the plurality of the power-supply devices, wherein the controller determines the plurality of power-supply devices, based on the measured DC output voltage values and predetermined voltage ranges corresponding to each of the plurality of power-supply devices.

2. The power-supply device determination apparatus according to claim 1, wherein the controller switches between a device determination mode configured to determine the plurality of power-supply devices, based on the voltage values measured by the voltage measuring part when the plurality of voltage transducers have the same step-up ratio, and a steady operation mode configured to individually control step-up ratios of the plurality of voltage transducers.

3. The power-supply device determination apparatus according to claim 2, wherein the controller individually controls step-up ratios of the plurality of voltage transducers, based on the result of determination on the plurality of power-supply devices in the device determination mode.

4. The power-supply device determination apparatus according to claim 2, wherein the controller individually controls step-up ratios of the plurality of voltage transducers so that the plurality of voltage transducers output the same voltage in the steady operation mode.

5. The power-supply device determination apparatus according to claim 2, further comprising a gang switch configured to turn ON/OFF the connection of power output from the plurality of voltage transducers, wherein the controller turns OFF the gang switch in the device determination mode and turns ON the gang switch in the steady operation mode.

6. The power-supply device determination apparatus according to claim 1, wherein the determining of the plurality of power-supply devices comprises deciding optimum step-up ratios for the plurality of power-supply devices.

7. A power conversion apparatus that can be connected with a plurality of power-supply devices, comprising: a plurality of connectors that can be connected with the plurality of power-supply devices; a plurality of voltage transducers connected in series with the plurality of connection parts; a voltage measuring part configured to measure direct current (DC) output voltage values as output of each of the plurality of voltage transducers; a controller configured to perform control so as to be capable of switching between a device determination mode configured to determine the plurality of power-supply devices, based on the DC output voltage values measured by the voltage measuring part when the plurality of voltage transducers have the same step-up ratio, and a steady operation mode configured to individually control step-up ratios of the plurality of voltage transducers, wherein determining the plurality of power-supply devices comprises identifying types of the plurality of the power-supply devices, wherein the controller determines the plurality of power-supply devices, based on the measured DC output voltage values and predetermined voltage ranges corresponding to each of the plurality of power-supply devices.

8. A method for determining a plurality of power-supply devices, comprising: a first voltage conversion step of voltage-converting, at the same step-up ratio, output powers of the plurality of power-supply devices; a voltage measuring step of measuring direct current (DC) output voltage values as output of each of a plurality of voltage transducers in the first voltage conversion step; and a determination step of determining the plurality of power-supply devices based on the DC output voltage values measured in the voltage measuring step, wherein determining the plurality of power-supply devices comprises identifying types of the plurality of the power-supply devices, wherein the determination step determines the plurality of power-supply devices, based on the measured DC output voltage values and predetermined voltage ranges corresponding to each of the plurality of power-supply devices.

9. The method for determining a plurality of power-supply devices according to claim 8, further comprising a second voltage conversion step of individually controlling step-up ratios of the plurality of voltage transducers, based on determination information obtained in the determination step of determining the power-supply devices.

* * * * *